United States Patent
Ohmoto et al.

(10) Patent No.: US 7,122,479 B2
(45) Date of Patent: Oct. 17, 2006

(54) ETCHING PROCESSING METHOD

(75) Inventors: Yutaka Ohmoto, Hikari (JP); Ryouji Fukuyama, Kudamatsu (JP); Mamoru Yakushiji, Kudamatsu (JP); Michinobu Mizumura, Kudamatsu (JP)

(73) Assignee: Hitachi High-Technologies Corporation, Tokyo (JP)

( * ) Notice: Subject to any disclaimer, the term of this patent is extended or adjusted under 35 U.S.C. 154(b) by 2 days.

(21) Appl. No.: 10/228,917

(22) Filed: Aug. 28, 2002

(65) Prior Publication Data
US 2003/0234238 A1    Dec. 25, 2003

(30) Foreign Application Priority Data
Jun. 19, 2002  (JP)  ............... P2002-178650

(51) Int. Cl.
*H01L 21/302* (2006.01)
(52) U.S. Cl. ............ 438/714; 438/725; 438/729; 216/67
(58) Field of Classification Search ........ 438/714, 438/725, 729; 216/67
See application file for complete search history.

(56) References Cited

U.S. PATENT DOCUMENTS

| | | | | |
|---|---|---|---|---|
| 5,202,273 | A * | 4/1993 | Nakamura | 505/330 |
| 6,040,248 | A * | 3/2000 | Chen et al. | 438/725 |
| 6,323,125 | B1 * | 11/2001 | Soo et al. | 438/645 |
| 6,362,109 | B1 | 3/2002 | Kim et al. | 438/706 |
| 6,402,974 | B1 * | 6/2002 | Trevor et al. | 216/67 |
| 6,465,159 | B1 * | 10/2002 | Ni et al. | 430/314 |
| 6,547,977 | B1 * | 4/2003 | Yan et al. | 216/72 |
| 2002/0177321 | A1 * | 11/2002 | Li | 438/710 |
| 2003/0234238 | A1 * | 12/2003 | Ohmoto et al. | 216/67 |

FOREIGN PATENT DOCUMENTS

WO     0101470    * 1/2001

OTHER PUBLICATIONS

"Enhanced borderless contact process-uses thin alumina layer to prevent erosion of mask oxide layer during RIE processing"; RD 337,045; May 10, 1992'; ANONYMOUS; abstract only.*

"Seleective deposition of tungsten into contact windows-including forming alumina insulating layer and titanium nitride sidewalls in windows"; RD 337,046; May 10, 1992'; ANONYMOUS; abstract only.*

* cited by examiner

*Primary Examiner*—George A. Goudreau
(74) *Attorney, Agent, or Firm*—Antonelli, Terry, Stout and Kraus, LLP.

(57) ABSTRACT

An etching processing method capable of etching a low dielectric constant layer at a reduced cost by using an etching processing apparatus comprising a vacuum vessel, a sample loading electrode disposed in the vacuum vessel, a gas introduction device for introducing a reaction gas into the vacuum vessel, an antenna for forming plasmas in the vacuum vessel, and a high frequency power supply for supplying a bias power to a sample loaded on the sample loading electrode, wherein the bias power to be supplied to the sample is 3 W/cm$^2$ or less, and the gas introduction device introduces a gas containing chlorine atoms or bromine atoms to apply etching processing to an inorganic insulation material of low dielectric constant loaded on the loading electrode.

10 Claims, 7 Drawing Sheets

ETCHING PROCESSING METHOD

BACKGROUND OF THE INVENTION

The present invention relates an etching processing method; and, more particularly, it relates to an etching processing method that is capable of decreasing the amount of particle contaminants and reducing the production cost.

For etching processing of insulation materials of low dielectric constant, for example, OSG (Organo-Silicate Glass), which is an inorganic insulation material of low dielectric constant doped with methyl groups, U.S. Pat. No. 6,362,109, for example, discloses an etching method which utilizes reaction gases mainly comprising fluoro carbons as a way of applying an oxide film etching technique.

When etching processing is conducted by utilizing reaction gases mainly comprising fluoro carbons, a reduction of the production cost becomes difficult, since the carbon ratio contained in the reaction gas is high, and the bias power to be applied to the wafers is increased. That is, since a high bias power is applied to the wafers, a power supply capable of supplying high power is necessary.

Further, in order to remove large amounts of input heat along with application of the high bias power, a chiller having a high cooling performance is necessary. Further, the withstand voltage of the components constituting the etching apparatus has to be increased, which increases the initial cost, and further increases the overall cost of the etching apparatus. Further, in the case where wafers having a large diameter, such as 300 mm, are processed, since the area of the chamber wall, which serves as the ground, is relatively decreased, the plasma potential fluctuates greatly by the bias voltage, and the chamber wall is consumed as it is subjected to sputtering. Accordingly, the chamber wall has to be replaced frequently, which results in an increase in the running cost.

Further, in a case of using inexpensive aluminum that has been subjected to alumite processing, which has generally been used as the material for the chamber wall, the aluminum material is exposed by abrasion of the alumite caused by the sputtering effect, in which aluminum fluoride, that is formed in the reaction between aluminum and fluorine, forms particles under the sputtering effect, thereby to lower the yield in the processing.

Further, when a gas having a high carbon ratio is used as described above, the deposition is caused in a chamber region where the plasma sputtering is weak. Accordingly, this frequently requires plasma cleaning or wet cleaning, involving opening of the chamber to the atmospheric air, which lowers the throughput.

Further, in the etching processing utilizing the reaction gases described above, fluoro carbons having a high carbon ratio, such as $C_5F_8$ have often been used. However, since these gases are special gases, they require high production cost, which results in an increase in the running cost.

SUMMARY OF THE INVENTION

This invention has been accomplished in an effort to eliminate the foregoing problems. Thus it is an object of the present invention to provide an etching processing method that is capable of etching low dielectric constant films at a reduced cost.

This invention provides an etching processing method using an etching processing apparatus comprising a vacuum vessel, a sample loading electrode disposed in the vacuum vessel, a gas introduction device for introducing a reaction gas into the vacuum vessel, an antenna for forming plasmas in the vacuum vessel, and a high frequency power supply for supplying a bias power to a sample loaded on the sample loading electrode, wherein the bias power supplied to the sample is 3 W/cm$^2$ or less, and the gas introduction device introduces a gas containing chlorine atoms or bromine atoms to apply etching processing to an inorganic insulation material of low dielectric constant loaded on the loading electrode.

BRIEF DESCRIPTION OF THE DRAWINGS

Other objects and advantages of the invention will become apparent from the following description of various embodiments, provided with reference to the accompanying drawings, in which.

DESCRIPTION OF THE PREFERRED EMBODIMENTS

Figure 1:
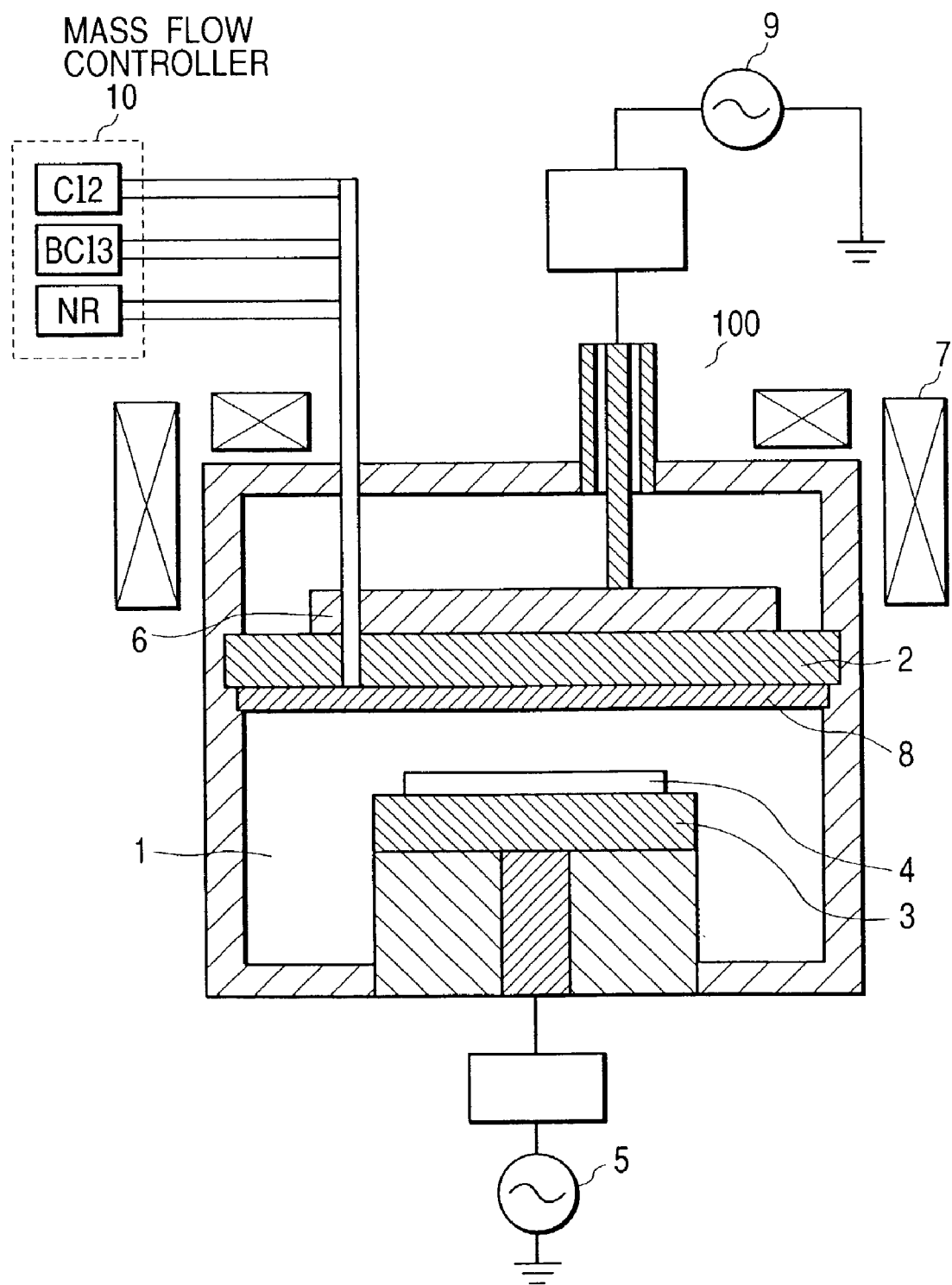
FIG. 1 is a diagrammatic cross-sectional view of an etching processing apparatus according to a preferred embodiment of this invention.

Embodiments of this invention will be described with reference to the accompanying drawings. FIG. 1 is a diagram of an etching processing apparatus according to an embodiment of this invention.

In the drawing, a reactive ion etching apparatus 100, using a high frequency power supply for supplying power in the UHF band, has a vacuum processing chamber 1; a quartz window 2 for introducing electromagnetic fields of the UHF band into the vacuum processing chamber 1; and a loading electrode 3, disposed opposite to the quartz window, on which a wafer 4 to form a semiconductor integrated circuit is loaded. A high frequency power supply 5 is provided for supplying a bias power to the loading electrode 3. An antenna 6 is connected with the quartz window 2 for introducing electromagnetic fields of the UHF band, that are supplied from the high frequency wave (UHF) power supply 9, into the vacuum processing chamber 1; and a solenoid coil 7 is provided for forming magnetic fields in the vacuum processing chamber 1. A gas dispersion plate 8 is provided for uniformly introducing a gas, that is supplied from a mass flow controller 10, into the vacuum processing chamber 1 in accordance with an etching recipe.

Upon processing, at first, a predetermined reaction gas is introduced by way of the mass flow controller 10 into the vacuum processing chamber 1 in accordance with the recipe, and to control the pressure in the vacuum processing chamber 1 to a predetermined pressure. Then, power is supplied to the solenoid coil 7 to form predetermined magnetic fields in the vacuum processing chamber 1; and, further, electromagnetic fields are introduced from the high frequency wave (UHF) power supply 9 so as to generate plasmas in the vacuum processing chamber 1. Subsequently, a predetermined bias power is applied from the high frequency power supply 5 by way of the loading electrode 3 to the wafer 4.

A first embodiment of this invention, using the apparatus pf FIG. 1, will be described. The processing condition is as follows: the high frequency power supplied from the high frequency (UHF) power supply 9 is 800 W, and the processing pressure in the vacuum processing chamber 1 is 4 Pa. Further, the gas recipe is as follows: the chlorine (hereinafter referred to as $Cl_2$) flow rate is 200 cc/min, the boron trichloride (hereinafter referred to as $BCl_3$) flow rate is 20 cc/min, and the flow rate of a premixed gas (hereinafter referred to as NR), that is formed by diluting methane to 4% concentration with argon, is 300 cc/min.

Figure 2:
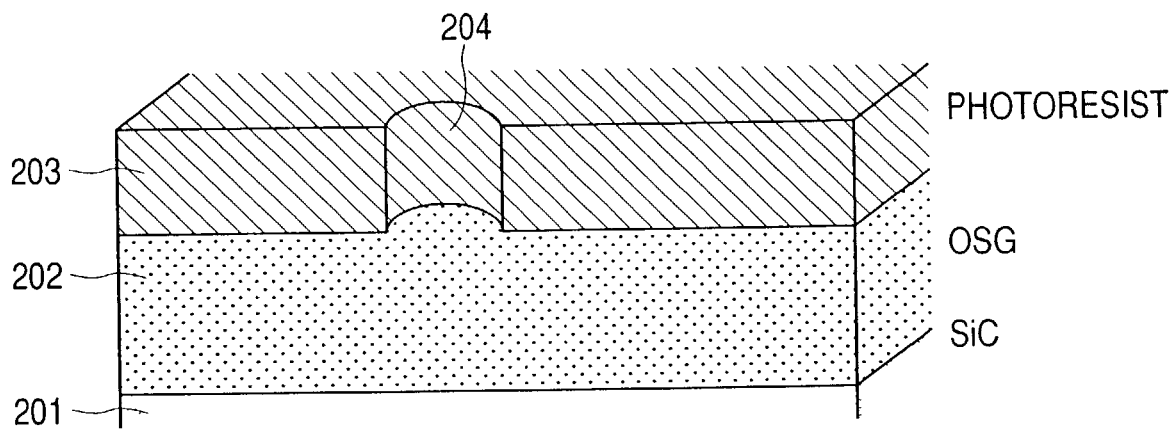
FIG. 2 is a diagrammatic perspective view showing a film structure of a wafer.

FIG. 2 is a view showing the film structure of a wafer that is used as a sample. The wafer diameter is 200 mm. As shown in the figure, an SiC film is formed as an etching stopper layer 201 for the underlying layer, and an OSG layer 202 and a photoresist layer 203 are formed successively on the etching stopper layer 201. Further, a pattern 204 of a mask formed in a photoresist layer 203 is used, for example, for formation of a via hole, that is to be used for connection between wiring layers.

Figure 3:
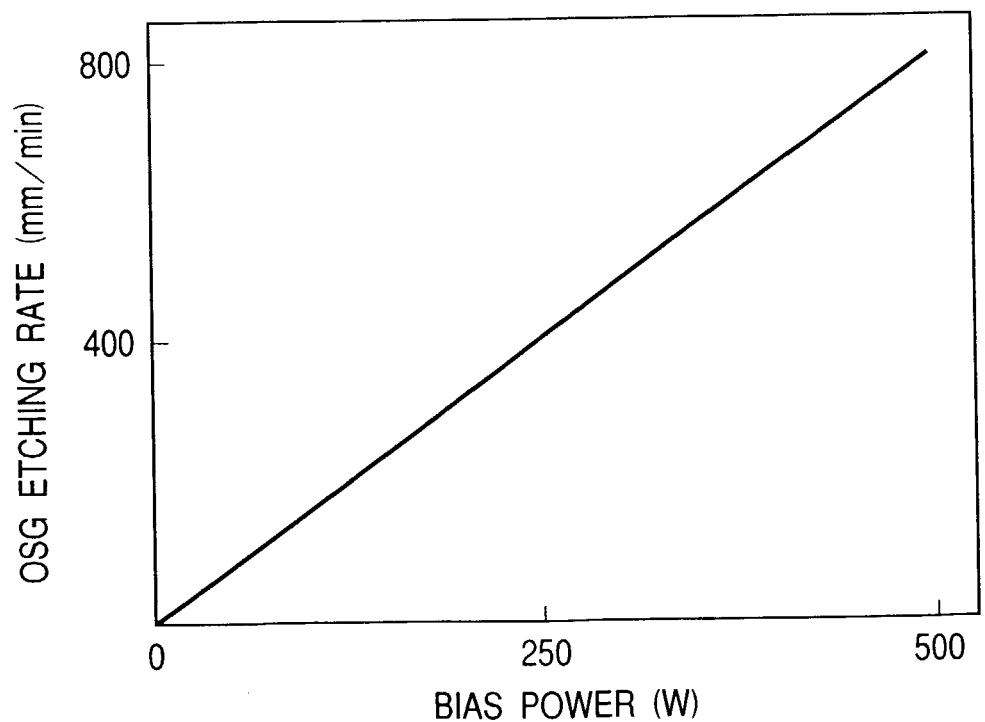
FIG. 3 is a graph showing bias power in relation to etching rate.

FIG. 3 is a graph showing the bias power in relation to the etching rate. As shown in the graph, the etching rate will increase/decrease substantially in proportion to an increase/decrease of the bias power, and it can be seen that an etching rate of about 400 nm/min can be obtained at a bias power of 250 W.

That is, it can be seen that an etching rate similar to that obtained with the above-mentioned fluoro carbon reaction gases can be obtained at a bias power of about ½ to ⅕ of that consumed when the fluoro carbon reaction gas is used. This is due to the difference of the radical reaction probability between F radicals caused by introduced fluoro carbon and Cl radicals in the introduced chlorine gas. Further, this is due to the fact that a bowing shape is less likely to be caused, even when the side wall protection effect with the carbon component is small, in a case of using a chlorine gas as the reaction gas.

Accordingly, although conventionally carbon has to be introduced at about 40% or more, in view of the elemental constitutional ratio of an introduction gas, in order to prevent occurrence of the bowing shape due to formation of the side wall, the introduction amount may be 10% or less in this embodiment. Therefore, excessive deposition is less likely to be caused, and etching processing can be conducted at a low bias power.

Figure 4:
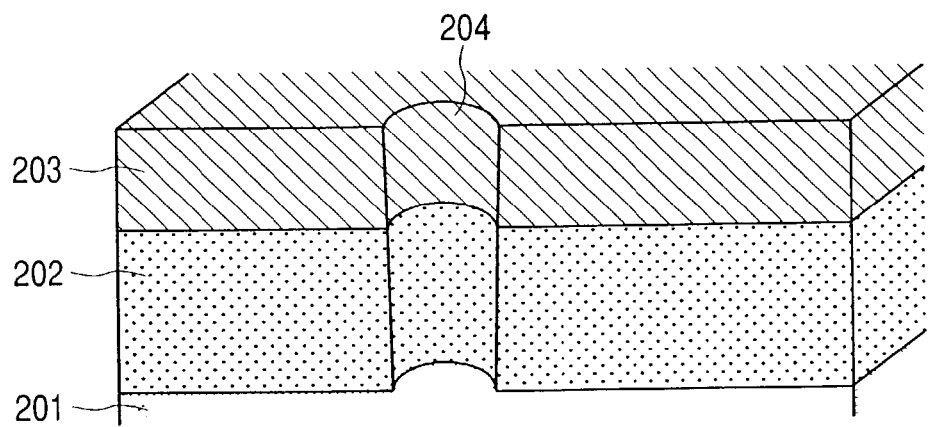
FIG. 4 is a diagrammatic perspective view showing a processed shape obtained at a bias power of 250 W.

FIG. 4 is a view showing a processed shape obtained at a bias power of 250 W. As shown in the figure, a wafer is subjected to a boring process in order to form an appropriately tapered shape, so as to be favorable for film deposition in the subsequent step.

Figure 5:
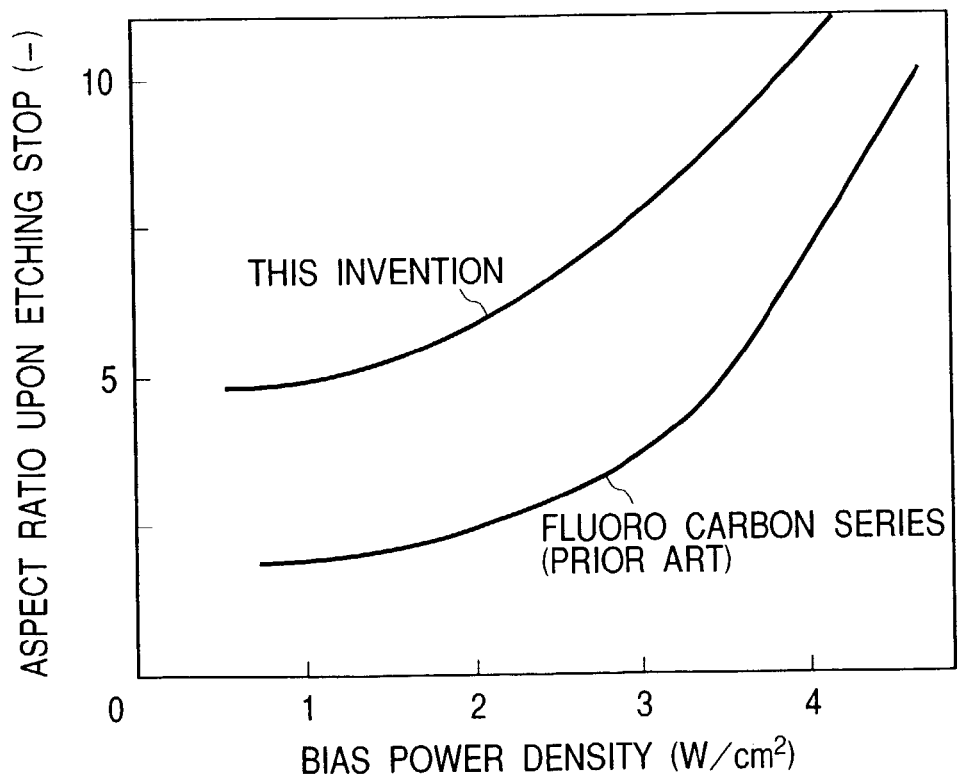
FIG. 5 is a graph showing the dependence on the bias power density of an aspect ratio at which etching is stopped.

FIG. 5 is a graph showing the dependence on the bias power density of an aspect ratio at which etching is stopped. In the boring process shown in the embodiment described above, a phenomenon is caused in which etching is stopped when the aspect ratio of the hole ((height of photoresist+depth of bored hole)/aperture diameter) increases beyond a certain value. FIG. 5 shows the dependence on the bias power density of the aspect ratio at which etching is stopped in comparison with the prior art (fluoro carbon series gas). In each of the cases, the aspect ratio at which etching is stopped decreases as the bias power is lowered. The characteristic curve of this embodiment is present above that for the prior art. That is, it can be seen that the necessary power density in the embodiment may be ½ to ⅓ of that of the prior art for an identical aspect ratio.

Figure 6:
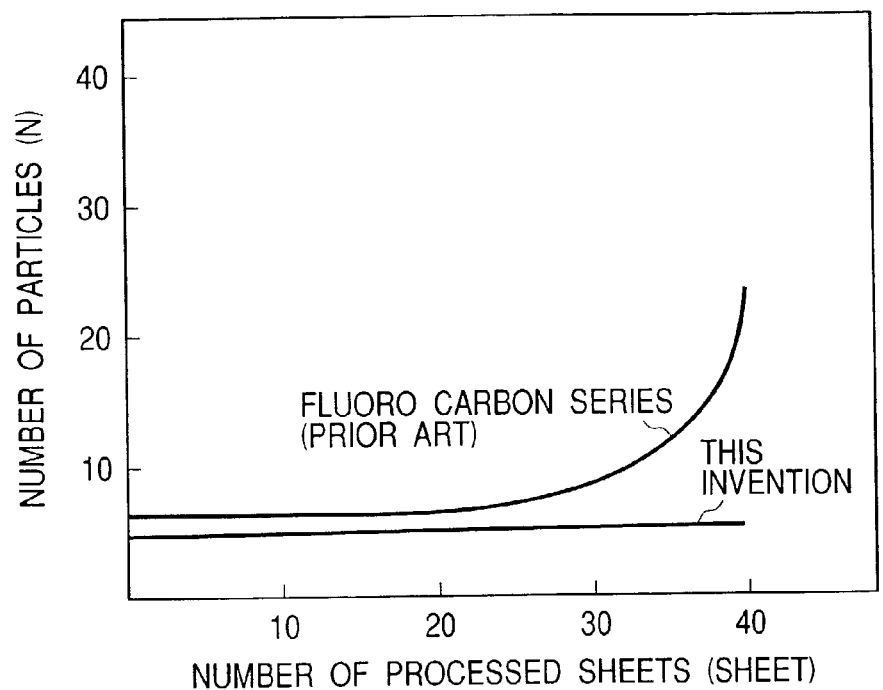
FIG. 6 is a graph showing the progress for the number of particles detected on a wafer relative to the number of wafers processed (accumulated value)

FIG. 6 is a graph showing the progress for the number of particles detected on wafers relative to the number of wafers processed (accumulated value). The conditions set for the processing are identical with the conditions described with reference to FIG. 1. As shown in the graph, the number of detected particles increases remarkably along with an increase in the number of sheets processed for the recipe using the existent fluoro carbon series gas, whereas the amount of increase of particles is small for the recipe using the chlorine series gas in this embodiment. Accordingly, the required frequency of the cleaning that is conducted by opening the vacuum processing chamber to atmospheric air can be decreased, and, as a result, the number of sheets processed per unit time can be increased remarkably.

Figure 7:
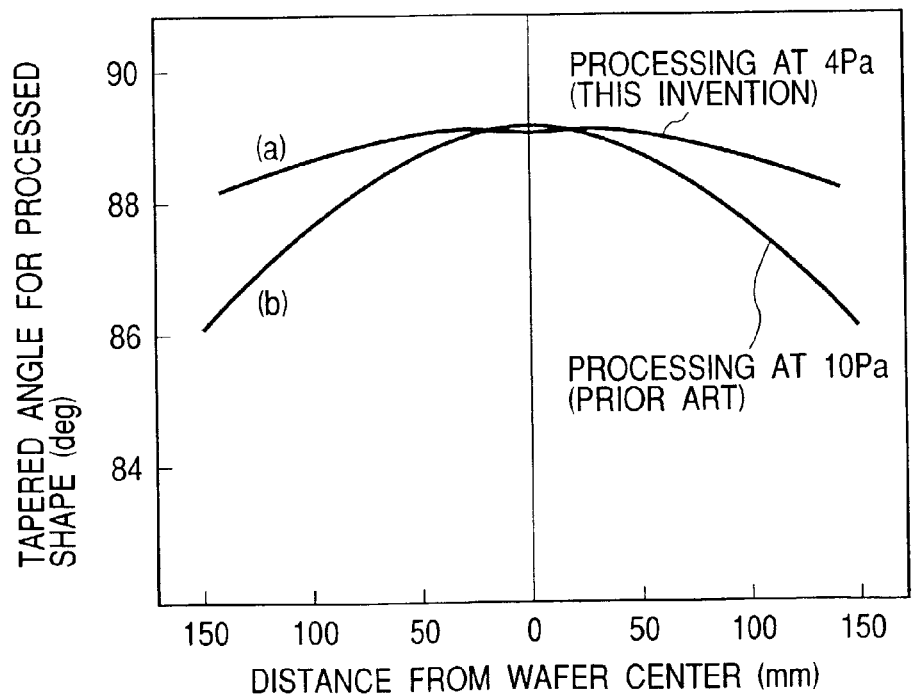
FIG. 7 is a graph showing an in-plane distribution of a tapered angle at a bored portion after a boring process.

FIG. 7 is a graph showing an in-plane distribution of a tapered angle for the bored portion after the boring process (hole formation). One of the effects obtained by lowering the bias power supplied to the wafer is an improvement in the uniformness for the in-plane processing of a large diameter wafer, typically represented by a 300 mm wafer. In the conventional apparatus, to prevent the occurrence of particles due to plasma diffusion along with application of a high bias voltage, a shield plate, for example, is disposed so as to surround the loading electrode in FIG. 1, thereby suppressing diffusion of the plasmas. However, such a shield plate hinders exhaustion of the introduced gas, thereby to increase the gas pressure in the wafer processing portion of the processing chamber (for example, it reaches 10 Pa) Therefore, a difference tends to be caused in the amount of incident flux within the wafer plane, and, particularly, the difference within the plane increases, as shown in FIG. 7 by curve (b), when processing a large diameter wafer. For example, it is difficult to apply processing to a coating for a film buried after etching, which deteriorates the device throughput.

On the contrary, in this embodiment, the required bias power is low (the required power for a 200 mm wafer is 600 W, which is ½ or ⅕ compared with that employed in the process using a fluoro carbon series gas); and, in addition, the reaction product of chlorine, included in the introduced gas, and the aluminum material, which is used as the side wall material of the processing chamber, causes less particles. Accordingly, shields are not required in this embodiment.

Accordingly, in this embodiment, holes each having a uniform tapered angle can be formed over the entire surface of the wafer uniformly, as shown in FIG. 7 by curve (a). This can facilitate coating of the film in the step after etching, and so devices can be mass-produced with a high yield and a great productivity.

Further, in the conventional apparatus which uses a processing gas of high carbon content, not only the material for the chamber wall, but also the fluoro carbon film deposited on a part of the chamber, is peeled, in response to a temperature change in the chamber, into fine fragments so as to form particles. Therefore, frequent cleaning is necessary, and cleaning with oxygen has been required for every processing for one sheet of wafer in the worse case. On the other hand, in this embodiment, the carbon content is 10% or less, and peeling, and the occurrence of particles caused thereby, can be suppressed by cleaning merely for each lot (25 sheets).

Now, the selectivity to the photoresist and the underlying film, and the control method for the processing shape, will be described in the etching apparatus of this embodiment In high density and high speed devices requiring insulation films of low dielectric constant, fine processing is naturally required and the minimum processing size is as fine as 100 nm or less. Addition of $BCl_3$ gas in this example provides a great effect on the fine processing accuracy.

Figure 8:
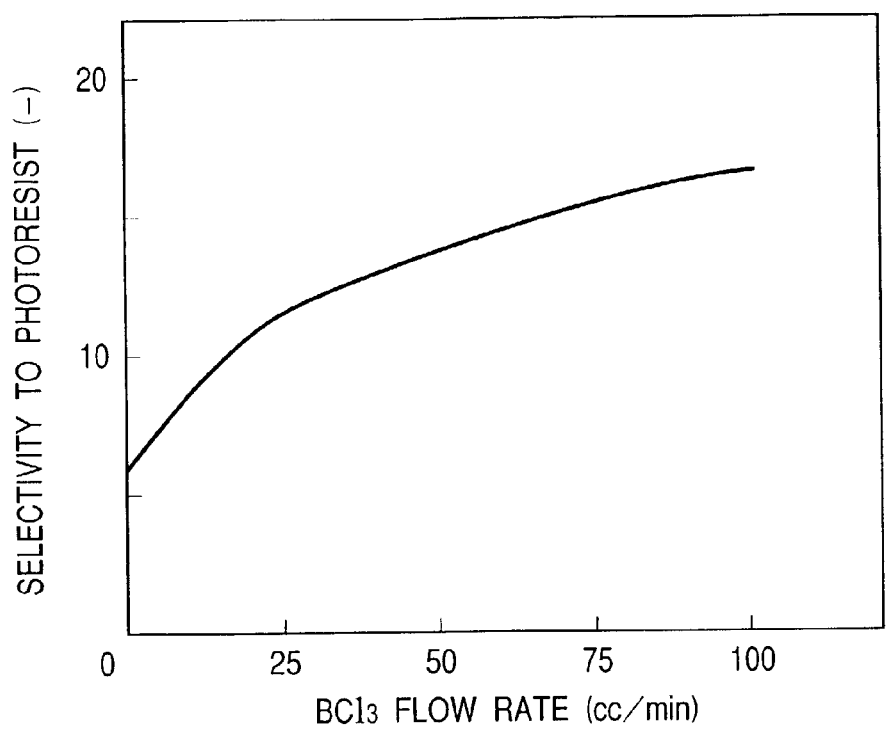
FIG. 8 is a graph showing the dependence on the BCl$_3$ addition amount of the etching rate selectivity of an OSG layer to a photoresist film.

FIG. 8 is a graph showing the etching rate selectivity dependence on the $BCl_3$ addition amount of the OSG film to the photoresist film. Other conditions are identical with those described above. It can be seen that the selectivity to the photoresist increases along with an increase of the $BCl_3$ addition amount. This is caused by the polymerization promotion effect of $BCl_3$, and the etching rate for the photoresist is suppressed by polymerizing mainly $CH_4$ gas on the surface of the photoresist. On the other hand, to enhance the etching rate selectivity of the OSG film to SiC as the underlying layer, it is necessary to deposit carbon-series deposition products at the bottom of the hole. In this case, the flow rate of $BCl_3$ is lowered to suppress the $CH_4$ polymerization rate, so that $CH_4$ is transported as far as the bottom of the hole.

Figure 9:
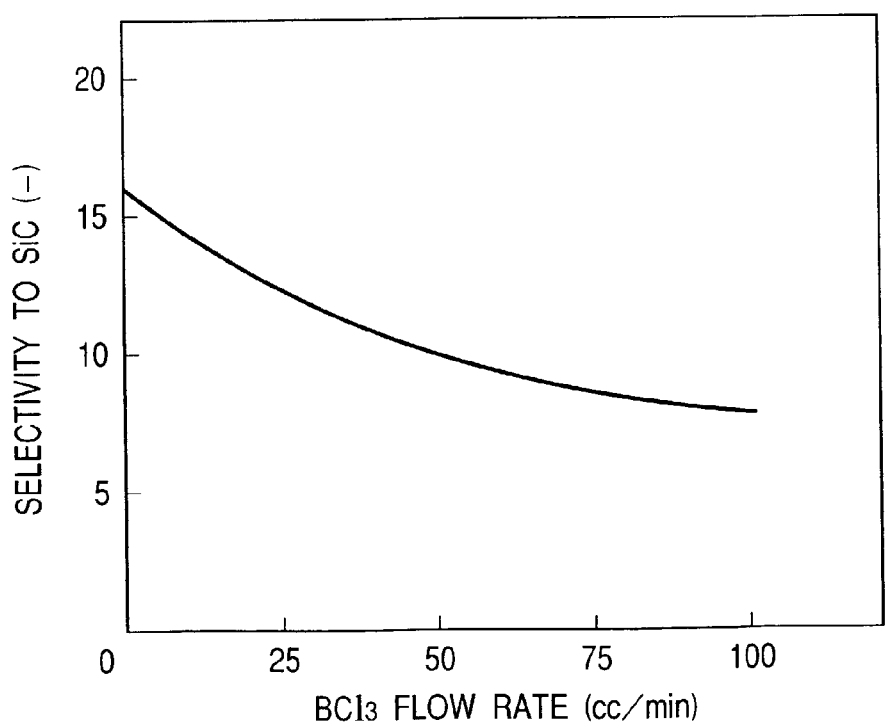
FIG. 9 is a graph showing the dependence on the BCl$_3$ flow rate of the selectivity of the hole bottom formed in the OSG layer to SiC.

FIG. 9 is a graph showing the selectivity dependence on the $BCl_3$ flow rate to SiC at the bottom of the hole. It can be seen that the selectivity is increased along with lowering of the $BCl_3$ flow rate. To further enhance the selectivity to the photoresist and the selectivity to the underlying SiC, a two step etching, which involves increasing the $BCl_3$ flow rate to 100 cc/min at the initial stage of etching and lowering the $BCl_3$ flow rate to 25 cc/min before exposure of the underlying film, was conducted. As a result, the selectivity for both of them was increased by 20%, respectively. A signal from a film thickness monitor was used for the switching of the steps, and, of course, the same effect can be obtained also by time control.

Figure 10:
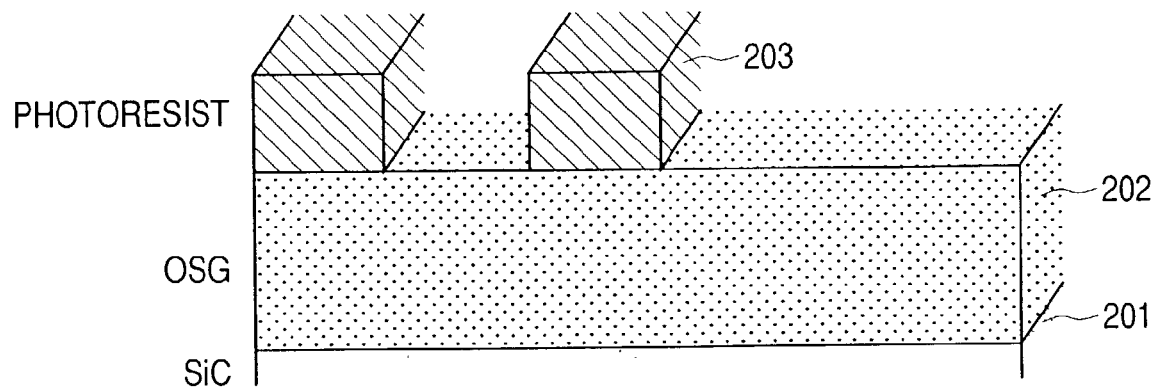
FIG. 10 is a diagrammatic perspective view illustrating a second embodiment of this invention.

FIG. 10 is a view showing a second embodiment according to this invention. In the device using a low dielectric constant film, not only are wirings formed by using through holes between wiring layers, but also wirings are often formed by burying (a so-called dual damascene structure). In this case, it is necessary to apply etching processing of grooves to the low dielectric constant film. The groove processing will be described for this embodiment.

As shown in the figure, an SiC film is used as an etching stopper layer 201 (intermediate stopper film). For the processing condition for the groove processing, the high frequency wave (UHF) power is 800 W, the processing pressure is 2 Pa and the bias power is 200 W. Further, for the gas recipe, the $Cl_2$ flow rate is 200 cc/min, the $BCl_3$ flow rate is 25 cc/min, and the NR flow rate is 400 cc/min. Compared with the case of hole boring processing, the NR gas flow rate and the $BCl_3$ flow rate are small, because deposition species can be transported easily in this processing compared with that in the hole boring processing. Thus, a sufficient selectivity can be obtained to the intermediate layer stopper film.

Since the intermediate layer stopper film increases the effective dielectric constant and, in addition, the processing cost thereof is high, there is a demand also for a process capable of omitting the same.

Figure 11:
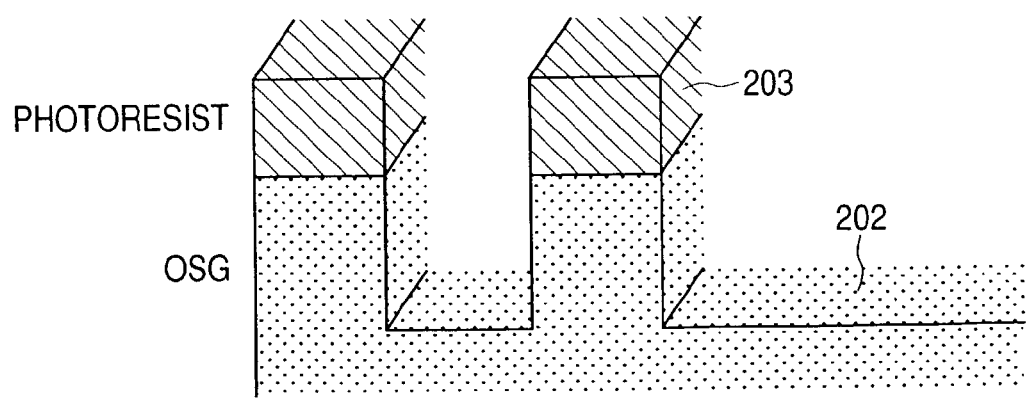
FIG. 11 is a diagrammatic perspective view illustrating a third embodiment of this invention.

FIG. 11 is a view showing a third embodiment. The processing conditions in this case are: 800 W of high frequency wave (UHF) power, 2 Pa of processing pressure, 400 W of bias power; and, the gas recipe includes a flow rate of 200 cc/min of $Cl_2$, a flow rate of 10 cc/min of $BCl_3$, and a flow rate of 400 cc/min of NR. The amount of NR gas is made larger than that in the groove processing, in order to decrease the depositing of deposition products on the side wall and to decrease the sub-trench phenomenon at the bottom of the groove. As a result, a favorable shape with no sub-trench, as shown in FIG. 11, could be obtained. Further, for the uniformness between coarse and dense portions, and within the wafer plane required for the structure with no intermediate stopper, a favorable result could be obtained at a practical level. This is because the process of this embodiment, basically, requires less deposition products for the protection of the side wall and can be operated at a low pressure.

Further, other advantages in common with each of the embodiments described above include less deterioration of the electrical properties of the film material. In the conventional etching technique, the addition of oxygen is necessary, for example, in hole boring processing to prevent etching stop at the bottom of the hole. However, the addition of oxygen selectively extracts carbon in the OSG film and changes the film structure to increase the dielectric constant. On the contrary, in a case of using the recipe in each of the embodiments, when the dielectric constant was evaluated for the OSG film after etching, it did not increase from the dielectric constant at the initial stage of the film deposition.

A description has been made for each of the embodiments mainly involving the use of a chlorine compound gas. However, the same effect can be expected also by the use of a bromine compound gas as an application of this concept.

As a fourth embodiment according to this invention, etching using a gas mixture with a bromine compound gas will be described. The processing conditions include: 1000 W of high frequency wave (UHF) and 2 Pa of processing pressure; and, the gas recipe includes a flow rate of 200 cc/min of hydrogen bromide (HBr), a flow rate of 50 cc/min of $BCl_3$, and a flow rate of 150 cc/min of NR. The sample is identical with that used in the first embodiment.

Since the reactivity is low in the case of a chlorine series gas, the etching rate was lowered to 320 nm/min at a bias power of 250 W; however, for the same result as in FIG. 4, which represents the etching result of the first embodiment, the NR gas flow rate may be ½ compared with the first embodiment because of the low reactivity, whereby the carbon-induced deposition products were further decreased, and the cleaning period could be further extended by at least twice.

For the addition gas, the same effect can also be obtained by an appropriate formulation so long as the gas is a carbon series gas in addition to the NR gas.

Figure 12:
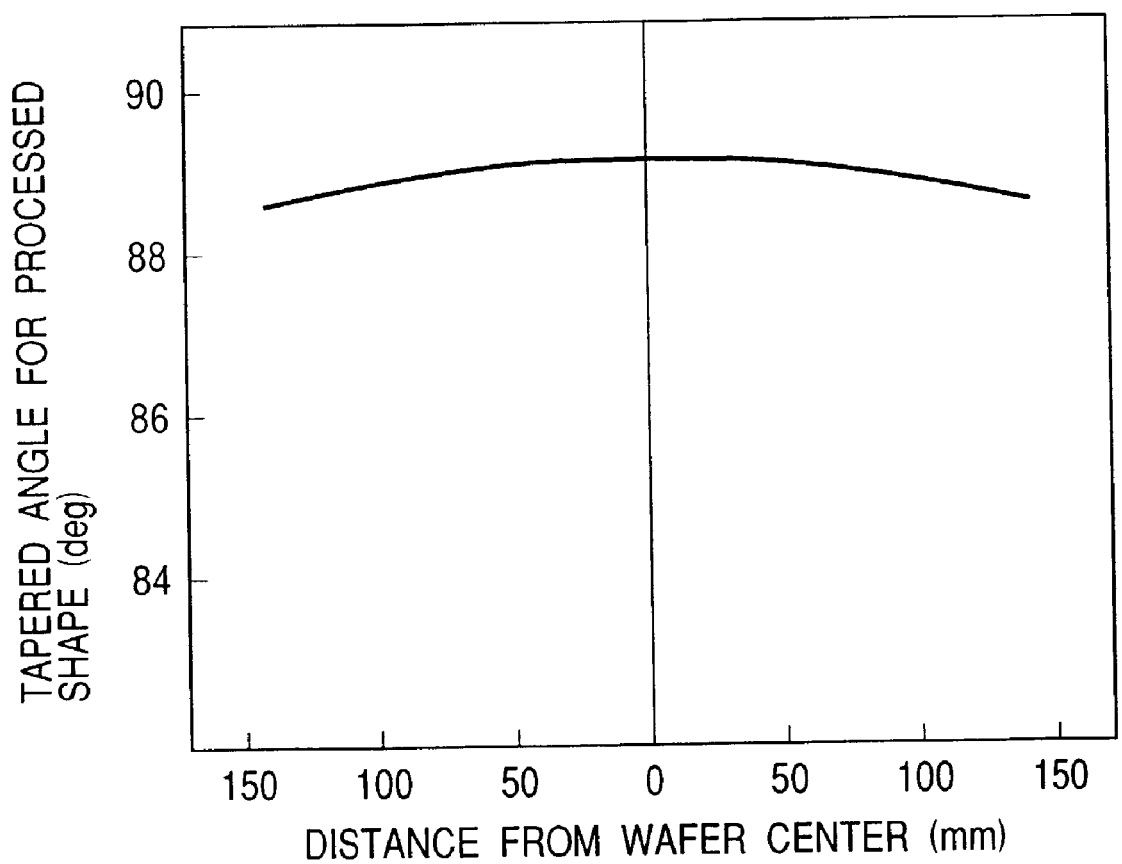
FIG. 12 is a graph showing in-plane distribution of a tapered angle at a bored portion after a boring process.

As a fifth embodiment according to this invention, a case using a $CH_2Cl_2$ gas will be described. The $CH_2Cl_2$ gas has a low combustibility and can be used in an equipment substantially identical with that for the NR gas. Accordingly, processing can be conducted at a further lower pressure, since dilution with an inert gas, such as Ar gas, is not necessary. The processing conditions include: 800 W of high frequency (UHF) power, 180 W of bias power and 0.6 Pa of processing pressure. The gas recipe includes a flow rate of 200 cc/min of $Cl_2$, a flow rate of 50 cc/min of $BCl_3$ and a flow rate of 8 cc/min of $CH_2Cl_2$. The sample is identical with that used in the first example. By lowering the processing pressure, the deviation of the tapered angle for the processed shape within the plane could be further decreased, as shown in FIG. 12.

Now, a sixth embodiment will be described for a case of using nitrogen (hereinafter referred to as $N_2$) as an addition gas. The addition of $N_2$ gas sometimes has an effect on the resist development (photoresist exposure failure referred to as resist poisoning). Therefore, the process is conducted up to the trench processing step in the via tip processing of a dual damascene free of such effect. The sample is identical with that shown in FIG. 10, as used in Example 2. The processing condition includes 800 W of high frequency wave (UHF) power, 250 W of bias power, and 1 Pa of processing pressure; and, the gas recipe includes a flow rate of 200 cc/min of $Cl_2$, a flow rate of 50 cc/min of $BCl_3$, and a flow rate of 100 cc/min of $N_2$. As a result of etching, a sufficient selectivity to the SiC, serving as the intermediate stopper layer could be obtained similar to that in the second embodiment.

As apparent from the foregoing descriptions, in the embodiments described above, etching by using mainly halogen atoms, other than fluorine, is conducted. In practicing the invention, the addition of a small amount of a fluorine atom containing gas provides an additional effect without deteriorating the effect of the invention, depending on the form of the sample.

For example, when a sample with an narrow trench width is processed in the third embodiment of the invention, a favorable processing shape, as obtained in the second embodiment, could be obtained by adding 10 cc/min of a $CF_4$ gas under the same state for other processing conditions, in which no negative effects, such as the occurrence of particles was not observed along with a slight increase of the carbon amount.

In the embodiments described above, OSGs to be processed can include, for example, CHORAL, trade name of products manufactured by Novellus, Black Diamond, trade name of products manufactured by Applied Materials and AUROLA, trade name of products manufactured by ASM. Further, not only the material obtained by CVD film deposition of them, but also those having an elemental constitution of SiOC or SiOCH can be used.

As described above, this invention can provide an etching processing method that is capable of etching a low dielectric constant layer at a reduced cost.

While the invention has been described with reference to preferred embodiments, it is to be understood that the terms which have been used are terms of description rather than limitation, and that changes within the purview of the appended claims may be made without departing from the true scope and spirit of the invention in its broader aspects.

What is claimed is:

1. An etching processing method using an etching processing apparatus comprising a vacuum vessel, a sample stage disposed in the vacuum vessel, a gas introduction device for introducing a reaction gas into the vacuum vessel, a power supply of an electric field for generating a plasma in the vacuum vessel, and a high frequency power supply for supplying a bias power to a sample loaded on the sample stage, wherein the sample has on a surface thereof a layer of an inorganic insulation material of low dielectric constant which has an elemental constitution of SiOC or SiOCH, and a layer of a photoresist as a mask overlying the layer of the inorganic insulation material, the method comprising the steps of:

supplying bias power to the sample at 3 $W/cm^2$ or less, and introducing, via the gas introduction device, a gas primarily containing chlorine atoms or bromine atoms to apply etching processing to said layer of said inorganic insulation material of low dielectric constant on the surface of the sample, using said photoresist as said mask.

2. An etching processing method using an etching processing apparatus comprising a vacuum vessel, a sample stage disposed in the vacuum vessel, a gas introduction device for introducing a reaction gas into the vacuum vessel, a power supply of an electric field for generating a plasma in the vacuum vessel, and a high frequency power supply for supplying a bias power to a sample loaded on the sample stage, wherein the sample has on a surface thereof a layer of an inorganic insulation material of low dielectric constant which has an elemental constitution of SiOC or SiOCH, and a layer of a photoresist as a mask overlying the layer of the inorganic insulation material, the method comprising the steps of:

supplying bias power to the sample at 3 $W/cm^2$ or less, and introducing, via the gas introduction device, said reaction gas which is primarily composed of a chlorine compound gas to apply an etching processing to said layer of said inorganic insulation material of low dielectric constant, which is doped with methyl groups, on the surface of the sample, using said photoresist as said mask.

3. The etching processing method as defined in claim 2, wherein the introduced gas is a gas mixture of a $CH_4$ gas and a $BCl_3$ gas, the flow rate of the $BCl_3$ gas is higher in the initial stage of etching and lower at the final stage of etching.

4. An etching processing method using an etching processing apparatus comprising a vacuum vessel, a sample stage disposed in the vacuum vessel, a gas introduction device for introducing a reaction gas into the vacuum vessel, a power supply of an electric field for generating a plasma in the vacuum vessel, and a high frequency power supply for supplying a bias power to a sample loaded on the sample stage, wherein the sample has on a surface thereof a layer of an inorganic insulation material of low dielectric constant which has an elemental constitution of SiOC or SiOCH, and a layer of a photoresist as a mask overlying the layer of the inorganic insulation material, the method comprising the steps of:

supplying bias power to the sample at 3 $W/cm^2$ or less, and introducing, via the gas introduction device, said reaction gas which is primarily composed of a bromine compound gas to apply etching processing to said layer of said inorganic insulation material of low dielectric constant, which is doped with methyl groups, on the surface of the sample, using said photoresist as said mask.

5. The etching processing method as defined in claim 1, wherein the introduced gas is a gas mixture of a $CH_4$ gas and a $BCl_3$ gas, the flow rate of the $BCl_3$ gas is higher in the initial stage of etching and lower at the final stage of etching.

6. The etching processing method as defined in claim 2, wherein at least one of a gas formed by diluting methane with argon and a $CH_2Cl_2$ gas is introduced as the introduced gas.

7. The etching processing method as defined in claim 1, wherein at least one of a gas formed by diluting methane with argon and a $CH_2Cl_2$ gas is introduced as the introduced gas.

8. The etching processing method as defined in claim 1, wherein the vessel has a saidside wall which is made of a material including aluminum and is grounded.

9. The etching processing method as defined in claim 2, wherein the vacuum vessel has a side wall which is made of a material including aluminum and is grounded.

10. The etching processing method as defined in claim 1, wherein a pressure inside said vacuum vessel, during said etching processing, is set at 4 Pa or less.

* * * * *